United States Patent [19]

Michail et al.

[11] Patent Number: 4,806,785

[45] Date of Patent: Feb. 21, 1989

[54] HALF CURRENT SWITCH WITH FEEDBACK

[75] Inventors: Michel S. Michail, Wappingers Falls; James L. Walsh, Hyde Park, both of N.Y.

[73] Assignee: International Business Machines Corporation, Armonk, N.Y.

[21] Appl. No.: 156,761

[22] Filed: Feb. 17, 1988

[51] Int. Cl.⁴ .......................................... H03K 19/08
[52] U.S. Cl. ................................. 307/131; 307/254; 307/448; 307/246; 307/454; 307/443
[58] Field of Search ........................ 307/77–131, 307/134, 240, 253, 254, 255, 261, 269, 270, 359, 362, 363, 443, 445, 446, 448, 450, 451, 455, 466, 464, 465, 467, 469, 491, 554; 328/167, 175; 330/254, 256, 257, 260, 261, 264, 294

[56] References Cited

U.S. PATENT DOCUMENTS

| | | | |
|---|---|---|---|
| 3,183,370 | 5/1965 | Trampel | 307/88.5 |
| 3,439,186 | 4/1969 | Seelbach | 307/214 |
| 3,450,896 | 6/1969 | Taniguchi et al. | 307/218 |
| 3,500,071 | 3/1970 | Jen | 307/268 X |
| 3,505,535 | 4/1970 | Cavaliere | 307/203 |
| 3,577,006 | 5/1971 | Tyrrell | 307/254 X |
| 3,845,405 | 10/1974 | Leidich | 303/207 P |
| 4,491,748 | 1/1985 | Chappell et al. | 307/443 |
| 4,529,894 | 7/1985 | Chan et al. | 307/454 |
| 4,531,067 | 7/1985 | Banker et al. | 307/254 X |
| 4,641,046 | 2/1987 | Becker et al. | 307/448 |
| 4,701,642 | 10/1987 | Pricer | 307/246 X |
| 4,725,743 | 2/1988 | Anderson | 307/448 X |

Primary Examiner—William M. Shoop, Jr.
Assistant Examiner—Paul Ip
Attorney, Agent, or Firm—William T. Ellis

[57] ABSTRACT

A half current switch comprising: at least one input transistor, a load resistance connected between a first voltage reference and the collector of the input transistor, a constant-current resistance connected between the emitter of the input transistor and a second voltage reference, and a feedback means including at least one feedback connected to the constant-current resistance. The feedback means further includes means for biasing the feedback transistor to drive a current through the constant current resistance which, when flowing, increases with an increasing main current and decreases with a decreasing main current through the input transistor. The feedback means thus causes a constant current to be drawn by the input transistor when it is conducting, thereby controlling the capacitance of the input transistor while maintaining the output level constant.

In a preferred embodiment, the feedback means comprises a PNP transistor with its base connected to the collector of the input transistor, with its emitter connected to the first voltage reference, and with its collector connected to the emitter of the input transistor. The PNP transistor not only acts as a feedback device to control current, but also acts to prevent oscillations when a speed-up capacitor is used in the circuit.

13 Claims, 2 Drawing Sheets

HALF CURRENT SWITCH WITH FEEDBACK

BACKGROUND OF THE INVENTION

The present invention relates generally to current switches, and more particularly to half current switches with excellent noise rejection and fast switching.

Present half current switch configurations provide proportionate IR output voltage drop variations in response to variations (noise) in the HIGH input level at their input transistors. Such IR drop voltage variations, if large enough, can result in erroneous switching operations in the system.

One solution to this noise switching problem is to connect a diode or the collector and emitter of an NPN transistor in parallel across the load resistor connected to the input transistor. Such a connection effectively holds the voltage across the load resistor to a prescribed value when it is drawing current. However, the extra current drawn by the clamping diode or NPN transistor increases the power consumption of the circuit and causes an increased emitter-base capacitance in the input transistor, resulting in a slower switching action. Note that the input capacitance of a transistor increases proportionately with increases in current through the transistor's emitter.

The invention as claimed is intended to remedy the above-described power dissipation and switching speed draw-backs to the half current switch. Additionally, the invention is designed to permit the use of a speed-up capacitance therein while suppressing circuit oscillation.

SUMMARY OF THE INVENTION

Briefly, the present invention comprises a half current switch including;

at least one input terminal;

at least one input transistor having a first and a second terminals for driving a main current therethrough, and a control terminal connected to the at least one input terminal for controlling the main current;

a first voltage reference;

load resistance means connected between the first voltage reference and the first terminal of the at least one input transistor;

a second voltage reference;

constant-current resistance means connected between the second terminal of the at least one input transistor and the second voltage reference; and feedback means including at least one feedback transistor connected to the constant-current resistance means and further including means for biasing the feedback transistor to drive a current through the constant-current resistance means which, when flowing, increases with an increasing main current and decreases with a decreasing main current in the at least one input transistor to thereby stabilize the main current drawn by the at least one input transistor.

In a preferred embodiment, the feedback transistor comprises a PNP transistor with its emitter connected to the first voltage reference, with its collector connected to the second terminal of the at least one input transistor, and with its base connected to the load resistance means.

In a further aspect of the present invention, the half current switch includes a speed-up capacitance means connected between the second terminal of the at least one input transistor and the second voltage reference for increasing the switching speed of the at least one input transistor. The feedback means further comprises means for charging the speed-up capacitance means when the voltage drop across the load resistance means initially increases in response to the main current being drawn by the at least one input transistor. This embodiment may further include a voltage-translating transistor, such as an emitter-follower transistor, with its control terminal connected to the load resistance means.

DETAILED DESCRIPTION OF THE PREFERRED EMBODIMENT

Figure 1:
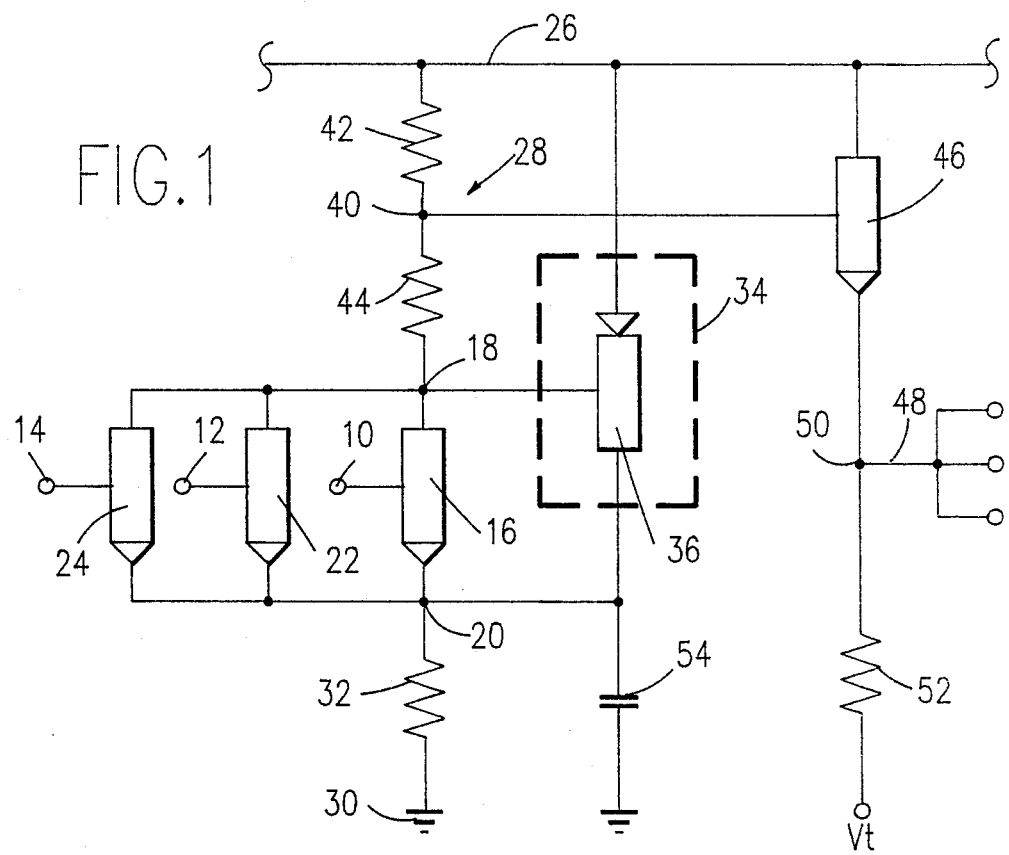
FIG. 1 is a schematic circuit diagram of a preferred embodiment of the present invention.

An example embodiment of the present invention is shown in FIG. 1.

Referring now to that Figure, there is provided at least one input terminal 10 and at least one input transistor 16 having a first terminal 18 and a second terminal 20 for driving a main current therethrough, and a control terminal connected to the at least one input terminal 10 for controlling the main current. In the embodiment shown in the Figure, there are provided two additional input transistors 22 and 24, with their control terminals connected to respective input terminals 12 and 14. It should be noted that NPN transistors are utilized in this example embodiment to implement the input transistors 16, 22, and 24. However, the present invention is not restricted to this particular type of transistor. A wide variety of other transistor types and transistor input configurations may be substituted therefor.

The circuit of FIG. 1 further includes a first voltage reference 26, and load resistance means 28 connected between the first reference voltage 26 and the first terminal 18 of the at least one input transistor. The circuit further includes a second reference voltage 30, which in the example of FIG. 1 is shown to be at ground potential. A constant current resistance means 32 is connected between the second terminal 20 of the at least one input transistor 16 and the second voltage reference 30.

It should be noted that the load resistance means 28 and the constant-current resistance means 32 may be implemented by a variety of different circuit configurations. For convenience, FIG. 1 represents these resistance means simply as the respective resistors 28 and 32.

Finally, the circuit includes feedback means 34 with a feedback transistor with the control terminal connected to a node with a voltage proportional to the voltage at collector node of the at least one input terminal. The feedback transistor is connected to the constant current resistance means 32 for driving a current through the constant-current resistance means 32 which, when flowing, increases with an increasing main current and decreases with a decreasing main current through the at least one input transistor to thereby stabilize the main current drawn by the at least one input transistor. The node for controlling the feedback transistor could be part of an auxiliary transistor circuit or an emitter follower circuit. In a preferred embodiment, the node comprises the collector terminal 18 for the input transistors 16, 22 and 24. In this preferred embodiment, the voltage at this node is thus proportional to the voltage drop across the load resistance means 28 when the at least one input transistor is drawing its main current.

In a preferred embodiment of the present invention, the feedback means 34 may be implemented by a PNP transistor with its emitter connected to the first voltage reference 26, with its collector connected to the second terminal 20 of the at least one input transistor 16, and with its base connected to the load resistance means 28. In the example embodiment shown in the Figure, the base of the PNP transistor is connected to the first terminal 18 of the at least one input transistor 16.

The circuit as thus described, constitutes a basic NOR circuit. The output for this circuit may be taken from the first terminal 18, or may be taken at some voltage divider point 40 in the load resistance means 28. In operation, when the transistors 16, 22, and 24 are not conducting, then no current is drawn through the load resistance means 28 and the voltage potential at the terminal 40 is basically determined by the first voltage reference 28. This voltage constitutes the HIGH level for the circuit. The low level at the terminal 40 is established when one or more of the input transistors 16, 22, or 24 is conducting current so that current is drawn through the load resistance means 28. This LOW level at the terminal 40 is basically established by subtracting the voltage drop across the resistor 42 from the first voltage reference level 26. The voltage drop across the resistor 42 is determined by the collector current drawn by the one or more of the input transistors 16, 22, and 24, which are conducting.

Feedback means 34 functions to stabilize the current drawn by each of the input transistor 16, 22, and 24. In operation, when none of the transistors 16, 22, and 24 is conducting, then the voltage at the control terminal 18 for the feedback means 34 is at a high level so that the PNP transistor 36 is not conducting. However, when one or more of the input transistors 10, 22, or 24 begins to conduct, then the voltage at the terminal 18 drops due to the IR voltage drop across the load resistance means 28. Accordingly, the PNP transistor 36 becomes conductive and drives a small current through the terminal 20 and into the constant-current resistance means 32. It can be seen that when the HIGH voltage at the input terminal for the input transistor which is conducting varies in voltage level, the PNP transistor 36 will provide a feedback current through the resistor 32 to prevent or nullify any change in the VBE of the input transistors 16, 22 or 24 thereby preventing or nullifying any change in the voltage at terminal 40 due to the change in the input voltage. More specifically, if a HIGH voltage at the input terminal 10 fluctuates up in value, this increase in the VBE for the input transistor 16 will cause that transistor to pull an increased level of current through the load resistance means 28. This increased current will increase the IR voltage drop across the load resistance means 28 so that the voltage level at the terminal 18 for the base for the PNP transistor 36 will drop. Accordingly, there will be an increase in the voltage difference between the emitter and the base terminals of the PNP transistor 36, causing that transistor to drive an increased amount of current therethrough to the resistor 32. This increase in current through the resistor 32 from the PNP transistor 36 will cause an increased IR voltage drop thereacross so that the second terminal 20 rises in voltage. Therefore, an upward voltage level fluctuation at the input terminal 10 for the input transistor 16 causes a concomitant upward movement of the voltage level at the second terminal 20. Accordingly, the VBE for the input transistor 16 remains approximately constant so that an approximately constant main current is drawn through the load resistor 42. Thus, the voltage drop thereacross remains constant.

Likewise, if the HIGH voltage level at the input terminal 10 fluctuates down in voltage level, then the VBE for the input transistor 16 decreases so that the main current drawn thereby also decreases. The result of this decreased current is that there will be a smaller IR voltage drop across the load resistance means 28 and the voltage level at the first terminal 18 rises. Accordingly, the voltage difference between the emitter and the base of the PNP transistor 36 decreases and the amount of current driven by the PNP transistor 36 into the resistor 32 decreases. This decreased current from the PNP transistor into the resistor 32 decreases the IR drop across the resistor 32, thereby resulting in a decrease in the voltage level at the second terminal 20. Accordingly, the drop in voltage level at the input terminal 10 causes a concomitant drop in voltage level at the second terminal 20 so that the VBE for the input transistor 16 remains constant.

The result of this control and stabilization of the VBE of the input transistors and thus the current through the input transistors 16, 22, and 24 is that the IR voltage drop across the load resistance means 28 is held approximately constant. However, this IR voltage drop control across the load resistance means 28 is achieved without dumping current from a by-pass clamping diode or clamping NPN transistor into the conducting input transistor 16. The elimination of the dumping of the bypass current into the input transistors eliminates the standard increase in the input capacitance that typically results from such an operation.

As noted previously, the output may be taken from the first terminal 18, or from some voltage division point 40 in the load resistance means 28. In many circuits, this output voltage is translated down in voltage by a voltage translation circuit. In FIG. 1, this voltage translation function is effected by a voltage translation transistor 46. The transistor 46 is connected in an emitter-follower configuration to drive a capacitive line 48 at its emitter terminal 50. Specifically, the collector of the emitter-follower transistor 46 is connected to the first voltage reference 26, and the emitter thereof is connected to the terminal 50. The base of the emitter-follower transistor is connected to the output terminal 40. The output terminal 40, in essence, splits the load resistance means 28 into two resistors 42 and 44. The purpose of dividing the load resistance means 28 is to reduce the voltage swing at the base of the emitter-follower transistor 46 to make that transistor's switching operation faster. The emitter-follower configuration further includes a pull-down resistor 52 for providing a voltage pull-down for the capacitive line 48. The other end of the pull-down resistor 52 may be connected to a third voltage reference VT. Note that the reduced voltage swing across the emitter-follower transistor 46 permits a lower pull-down resistance value at the resistor 52 to thereby enhance the switching speed for this emitter-follower transistor 46.

Although the example of the present invention shown in FIG. 1 utilizes a single emitter-follower transistor 46 to drive the capacitive line 48, it is understood by those skilled in the art that a wide variety of different transistor driving configurations may be substituted therefor. In this regard, an active device may be substituted for the pull-down resistor 52. This emitter-follower translation circuit may be implemented by a variety of different transistor configurations using different transistor types.

It should be noted that when the output signal at the node 50 is at a low voltage, one or more of the logic transistors 16, 22, and 24 are conducting, but the emitter-follower transistor 46 is almost off. When the output level at the node 50 is high, then all of the input transistors 16, 22, and 24 are non-conductive, while the emitter-follower transistor 46 is conducting. Since the turn-on current for all of these transistors may be made approximately equal, then this circuit represents a load with virtually no variation in power supply current.

It should be noted that an important aspect of the present invention is that the feedback means 34 facilitates the use of a speed-up capacitor 54. A typical speed-up capacitor 54 would be connected between the second terminal of the input transistor 16 and the second voltage reference 30. When a HIGH voltage pulse is applied to the input terminal 10 for the input transistor 16, it is desirable that the VBE for this transistor be as large as possible in order to facilitate a fast switching of the input transistor 16 into a conduction mode. However, the emitter terminal 20 for the input transistor 16 tends to follow the base voltage, due to the intrinsic capacitance therebetween. By disposing the speed-up capacitor 54 at the emitter terminal 20, then an additional charge is required to raise the voltage of the capacitor 54 before the emitter terminal 20 can rise in voltage and track the base node 10. From an AC standpoint, the addition of the speed-up capacitance lowers the AC impedance at the emitter in response to a high frequency change applied to the input terminal 10 for the device. Accordingly, the addition of the speed-up capacitor 54 connected to the second terminal 20 prevents the emitters of the input transistors from immediately following a change in voltage at their respective base input terminals. Thus, a large VBE is presented to the input transistor so that a very fast current rise is obtained through the collector of the input transistor.

Figure 2:
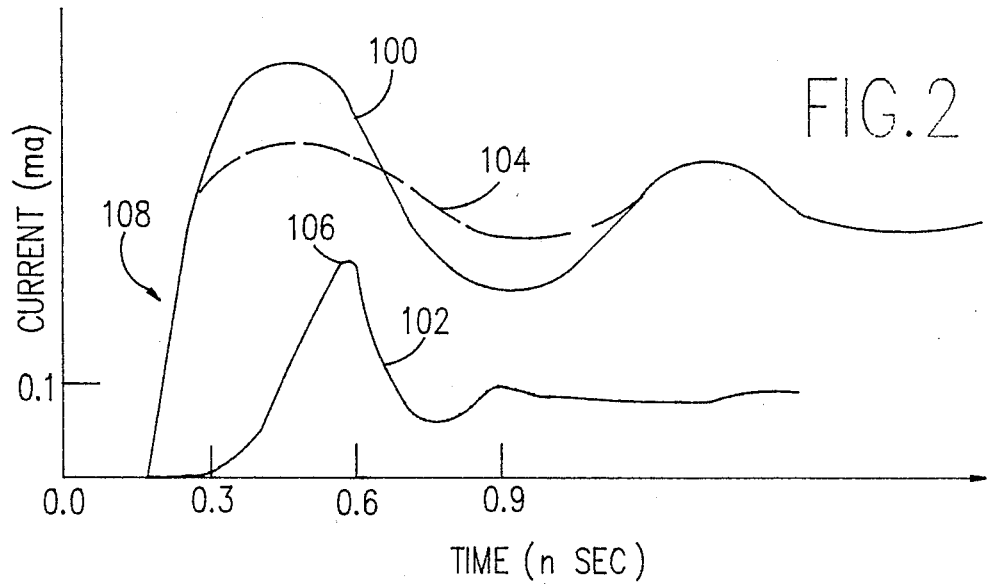
FIG. 2 is a current versus time graph showing the switching operation of the preferred embodiment.

The basic problem with the use of a speed-up capacitor is that the addition of this capacitive impedance to the capacitance of the input transistor creates a feedback loop which can result in the oscillation of the circuit. However, it has been discovered that when the feedback means of the present invention is used in the switching circuit, the voltage level at the first terminal 18 drops sufficiently so that the feedback means 34 becomes conductive, an initial sharp current pulse will occur before it reaches an approximate steady level of current through the device. This A.C. current pulse limits the initial current demand through the input transistor which is conducting. Accordingly, this initial current pulse through the feedback means 34 acts as a negative feedback to limit the high frequency AC current response of the device to thereby prevent circuit oscillation. This operation is illustrated graphically in FIG. 2. The curve 100 is a representation of the collector current pulled through the terminal 18, assuming that no feedback means 34 is included in the circuit. The curve 102 is a representation of the current driven through the PNP transistor 36. The dashed line 104 represents the modification to the current response through the terminal 18 when the PNP feedback transistor 36 is present. It can be seen that the short current pulse 106 on the current curve for the PNP transistor 36 provides an initial limitation on the current demand through the input transistor collector terminal 18, thereby limiting the potential for oscillation of the circuit. However, note that the PNP transistor 36 does not begin to conduct at the same time as the input transistors. Rather, the PNP transistor 36 begins to conduct only when the voltage at the terminal 18 has dropped sufficiently so that the VBE for the transistor 36 is at its threshold. (This depends on the time constant for node 18). Accordingly, the occurrence of the PNP transistor current pulse 106 is slightly delayed in time relative to the beginning of the response for the curve 100 for the input transistor 16. Thus, the conduction of current by the PNP transistor 36 has no effect on the very fast switching time for the input transistor 16. Note, that this switching time is represented by the steep slope 108 for the curve 100.

Figure 3:
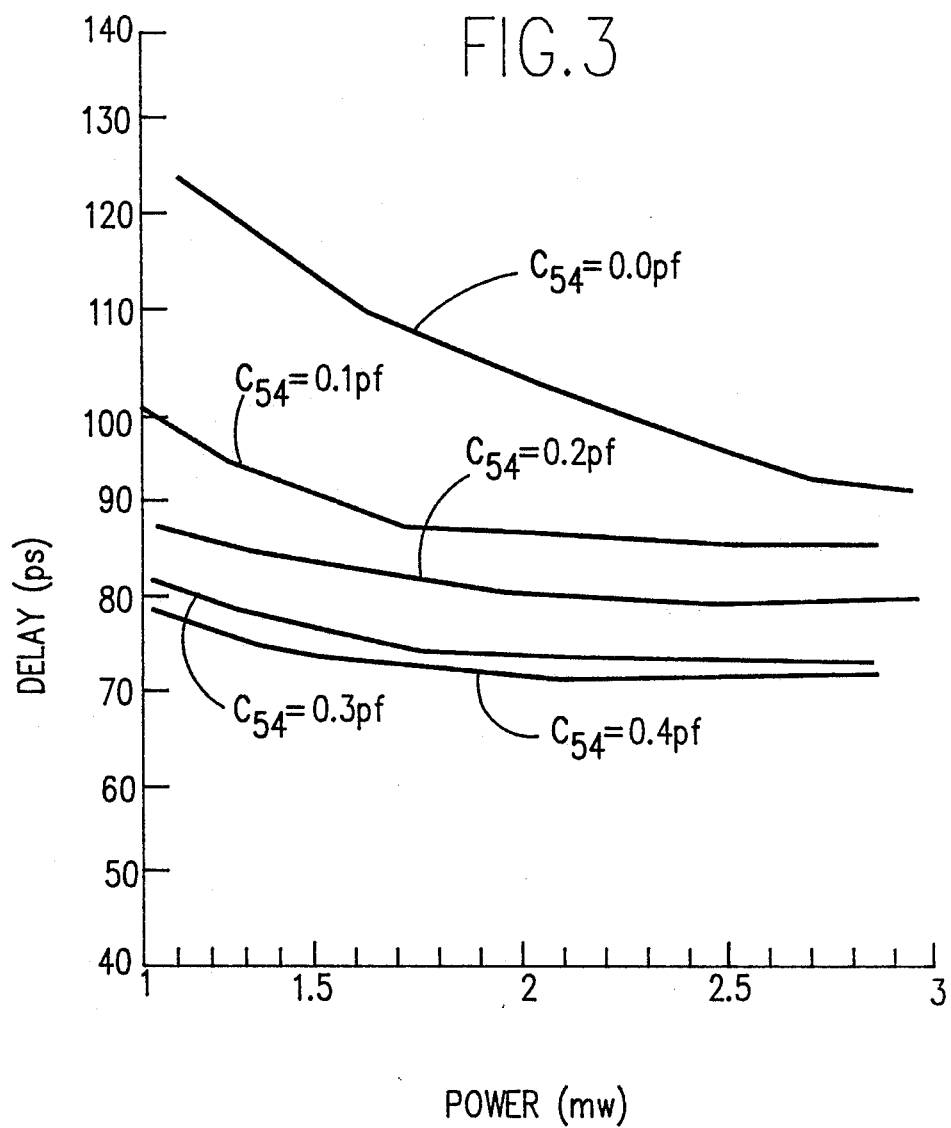
FIG. 3 is a delay versus power graph for the invention and includes a plurality of curves representing different speed-up capacitor values.

FIG. 3 represents the speed-power characteristics of the circuit of FIG. 1. This speed-power plot was calculated and optimized to guarantee a nominal logic swing of 600 mV for a fanout=3, fanin=3, and a wiring load capacitance of equivalent 0.3 pF. Five different curves are shown in the graph, each curve representing the characteristic of the circuit utilizing a different capacitance for the speed-up capacitor 54. The top curve represents the circuit with no speed-up capacitor 54 in the circuit. It can be seen that the speed-up capacitor 54 provides a significant improvement in switching speed. Additionally, it can be seen that the speed degradation of the circuit response as the power is decreased is low. In this regard, the bottom curve utilizing the speed-up capacitance of 0.4 pf has a delay of approximately 72 pf at 3 millowatts of power, while at a lower power level of 1.5 millowatts, the delay has only degraded by 1-2 ps. Such high switching speed at such a low power and with such few devices in the circuit is a breakthrough in the art.

The present invention provides an excellent noise margin as a function of power supply temperature variation. In this regard, a spurious signal present at the circuit input terminal will not propagate through subsequent switching cells, even under worst case environments of temperature and power supply with the present circuit. This noise rejection is accomplished by means of the stabilization of the current through the input transistors. This stabilization is accomplished without increasing the input capacitance of the input transistors, as occurs in prior art diode and NPN clamps.

Additionally, the present circuit facilitates the use of speed-up capacitors by providing a delayed charging of the speed-up capacitor by the feedback means to thereby reduce the initial ringing or oscillation in the circuit. This circuit thus permits the use of large speed-up capacitors with sharp current transitions. Finally, the present circuit has a delay which degrades only very slightly with decreases in power to the circuit.

While the present invention has been particularly shown and described with reference to preferred embodiments therefor, it will be understood by those skilled in the art that the foregoing and other changes in form and detail will be made therein without departing from the scope and spirit of the present invention.

We claim:
1. A half current switch comprising:
   at least one input terminal;

at least one input transistor having a first and a second terminals for driving a main current therethrough, and a control terminal connected to said at least one input terminal for controlling said main current;

a first voltage reference;

load resistance means connected between said first voltage reference and said first terminal of said at least one input transistor;

a second voltage reference;

constant-current resistance means connected between said second terminal of said at least one input transistor and said second voltage reference; and feedback means including at least one feedback transistor connected to said constant-current resistance means for driving a current through said constant-current resistance means which, when flowing, increases with an increasing main current and decreases with a decreasing main current through said at least one input transistor to thereby stabilize said main current drawn by said at least one input transistor.

2. A half current switch as defined in claim 1, wherein said biasing means connects the control terminal of said feedback transistor to said load resistance means and, when conducting, drives a current through said constant-current resistance means which is proportional to at least a part of the voltage drop across said load resistance means.

3. A half current switch as defined in claim 1, further comprising speed-up capacitance means connected between said second terminal of said at least one input transistor and said second voltage reference for increasing the switching speed of said at least one input transistor; and wherein said feedback means further comprises means for charging said speed-up capacitance means when the voltage drop across said load resistance means initially increases in response to said main current being drawn by said at least one input transistor.

4. A half current switch as defined in claim 3, further comprising speed-up capacitance means connected between said second terminal of said at least one input transistor and said second voltage reference for increasing the switching speed of said at least one input transistor; and wherein said feedback means further comprises means for charging said speed-up capacitance means when the voltage drop across said load resistance means initially increases in response to said main current being drawn by said at least one input transistor.

5. A half current switch as defined in claim 3, wherein said feedback means comprises a PNP transistor with its emitter connected to said first voltage reference, with its collector connected to said second terminal of said at least one input transistor, and with its base connected to said load resistance means.

6. A half current switch as defined in claim 5, further comprising a voltage-translating transistor with its control terminal connected to said load resistance means.

7. A half current switch as defined in claim 1, wherein said feedback means comprises a PNP transistor with its emitter connected to said first voltage reference, with its collector connected to said second terminal of said at least one input transistor, and with its base connected by said biasing means to said load resistance means, and wherein said at least one input transistor comprises an NPN transistor.

8. A half current switch as defined in claim 1, wherein there is no reference transistor with its base connected to a constant reference voltage and emitter-dotted with said at least one input transistor.

9. A half current switch, comprising:

at least one input terminal;

at least one input bipolar NPN transistor with its base connected to said at least one input terminal;

a first voltage reference;

a load resistance connected between said first voltage reference and the collector of said at least one input transistor;

a second voltage reference;

a constant-current resistance connected between the emitter of said at least one input transistor and said second voltage reference;

a speed-up capacitance connected between said emitter of said at least one input transistor and said second voltage reference; and a PNP transistor with its base connected to a node with a voltage which is proportional to the voltage at the collector of said at least one input transistor, with its emitter connected to said first voltage reference, and with its collector connected to said emitter of said at least one input transistor, for driving a current through said constant-current resistance to thereby control the current drawn by said at least one input transistor and for charging said speed-up capacitance when the voltage drop across said load resistance initially increases in response to a HIGH voltage at said at least one input terminal.

10. A half current switch as defined in claim 9, further comprising an emitter-follower transistor with its base connected to said load resistance, with its collector connected to said first voltage reference, and with its emitter connected to an OUT terminal.

11. A half current switch as defined in claim 9, wherein said node is said collector node for said at least one input transistor.

12. A half current switch as defined in claim 10, wherein there are at least two of said input transistors with their collectors connected together and with their emitters connected together, but with their bases connected to different input terminals.

13. A half current switch as defined in claim 10, wherein said PNP transistor has a switching speed of at least 2 GHz.

* * * * *